United States Patent [19]
Robinson

[11] Patent Number: 5,670,817
[45] Date of Patent: Sep. 23, 1997

[54] MONOLITHIC-HYBRID RADIATION DETECTOR/READOUT

[75] Inventor: David A. Robinson, Oceanside, Calif.

[73] Assignee: Santa Barbara Research Center, Goleta, Calif.

[21] Appl. No.: 397,818

[22] Filed: Mar. 3, 1995

[51] Int. Cl.⁶ ............................................. H01L 31/00
[52] U.S. Cl. .................... 257/443; 257/446; 257/458; 257/461; 250/208.1; 250/332; 250/370.14
[58] Field of Search ........................... 257/442, 443, 257/446, 458, 461; 250/208.1, 332, 370.08, 370.12, 370.13, 370.14

[56] References Cited

U.S. PATENT DOCUMENTS

| | | | |
|---|---|---|---|
| 5,155,362 | 10/1992 | Baker | 250/332 |
| 5,244,817 | 9/1993 | Hawkins et al. | 437/2 |

OTHER PUBLICATIONS

"Bonded Wafer Substrates for Integrated Detector Arrays", J.J. Wang et al., IEEE Transactions on Nuclear Science, vol. 40, No. 5, Oct. 1993.

*Primary Examiner*—Minh-Loan Tran
*Attorney, Agent, or Firm*—W. C. Schubert; W. K. Denson-Low

[57] ABSTRACT

Methods are disclosed for fabricating a monolithic array of radiation detectors and associated readout circuits, as are monolithic arrays fabricated by the methods. One method includes the steps of (a) providing a first substrate (10) having a first major surface (10a) and an oppositely disposed second major surface (10b); (b) doping the first major surface with a dopant having a first type of electrical conductivity to form a first doped region (12) adjacent to the first major surface; (c) forming an electrically insulating dielectric layer (14) on the first major surface; (d) thermally bonding a second substrate to the dielectric layer and thinning the second substrate to provide a semiconductor layer (16) having a predetermined thickness; (e) delineating the semiconductor layer into a plurality of adjacently disposed electrically isolated regions each of which corresponds to a radiation detector unit cell; (f) fabricating a readout integrated circuit (17) within a portion of the semiconductor layer within each of the unit cells; (g) conductively coupling (22, 23) each of the readout integrated circuits to an underlying portion of the first doped region; and (h) doping the second major surface with a dopant having a second type of electrical conductivity to form a second doped region (24) adjacent to the second major surface. The second major surface is a radiation receiving surface of the monolithic array.

7 Claims, 5 Drawing Sheets

MONOLITHIC-HYBRID RADIATION DETECTOR/READOUT

FIELD OF THE INVENTION

This invention relates generally to integrated circuit fabrication techniques and, in particular, to radiation detectors and to methods for fabricating radiation detectors.

BACKGROUND OF THE INVENTION

One conventional method to electrically interconnect a radiation detector and an associated readout integrated circuit is to employ bump technology. However, this approach places limitations on a minimum radiation detector (pixel) size and on a maximum pixel packing density. Furthermore, the use of additional process steps to form the bumps, typically indium or solder bumps, and to subsequently hybridize the radiation detector with the readout circuit increases the cost and may reduce the yield.

At present, Charge Coupled Device (CCD) imagers are used in a wide variety of applications from consumer cameras to scientific (astronomical) cameras. Such devices tend to be limited in light saturation level (full well), radiation hardness, and speed of operation. In general, monolithic x-y addressed CCD arrays have responsivity (fill factor) limitations and size limitations imposed by a need to provide each pixel with both a radiation detector and readout circuitry. Hybrid, as opposed to monolithic, detector arrays can be designed to overcome the limitations of CCD and x-y imagers; however, hybrid arrays are limited by the above-described required hybrid bump processing.

In an article entitled "Bonded Wafer Substrates for Integrated Detector Arrays", IEEE Transactions on Nuclear Science, Vol. 40, No. 5, Oct. 1993, J. J. Wang et al. describe the use of bonded wafer substrates for integrating high energy particle detector arrays with associated readout electronics. Particle detection occurs in a relatively thick <111> Si wafer, and the readout electronics is fabricated within a <100> Si film. The <111> wafer and the <100> film are physically and electrically isolated from one another by an intervening layer of radiation hardened dielectric. In this approach a p+ detector array pattern is formed in a surface of the <111> silicon wafer before bonding the <111> wafer to a <100> silicon wafer which is subsequently thinned. Vias are subsequently etched through the dielectric layer and are backfilled with polysilicon to electrically connect the p+ detector array pattern to the readout circuitry. No technique for fabricating an array of such devices is disclosed.

Of general interest in this area is U.S. Pat. No. 5,244,817 (Hawkins et al.) which describes the fabrication of a backside illuminated solid state image sensor that employs the bonding of two wafers together with oxide layers. One of the oxide layers contains a boron implanted or diffused p+ layer that is subsequently exposed to form the sensor backside surface.

It is an object of this invention to provide a method for fabricating a monolithic radiation detector/readout integrated circuit array that employs fusion bonded silicon films, a high degree of electrical isolation between adjacent radiation detector elements, and that may be x-y addressed to readout the individual ones of the detector elements.

SUMMARY OF THE INVENTION

The foregoing and other problems are overcome and the objects of the invention are realized by methods for fabricating a monolithic array of radiation detectors and associated readout circuits, and by monolithic arrays fabricated by the methods.

A first method includes the steps of (a) providing a first substrate having a first major surface and an oppositely disposed second major surface; (b) doping the first major surface with a dopant having a first type of electrical conductivity to form a first doped region adjacent to the first major surface; (c) forming an electrically insulating dielectric layer on the first major surface; (d) thermally bonding a second substrate to the dielectric layer and thinning the second substrate to provide a semiconductor layer having a predetermined thickness; (e) delineating the semiconductor layer into a plurality of adjacently disposed regions each of which corresponds to a radiation detector unit cell; (f) fabricating a readout integrated circuit within a portion of the semiconductor layer within each of the unit cells; (g) conductively coupling each of the readout integrated circuits to an underlying portion of the first doped region; and (h) doping the second major surface with a dopant having a second type of electrical conductivity to form a second doped region adjacent to the second major surface. The second major surface is a radiation receiving surface of the monolithic array.

In one embodiment of this first method the steps of doping are accomplished by diffusing a dopant through the surface of the substrate, while in another embodiment the steps of doping are accomplished by implanting a dopant through the surface of the substrate.

In another embodiment of the first method the step of delineating includes the steps of (a) forming trenches through the semiconductor layer and through the underlying dielectric layer to expose an underlying portion of the first major surface; and (b) counter-doping the first doped region of the substrate through the exposed portion of the first major surface with a dopant having the second type of electrical conductivity.

In another embodiment of the first method the step of delineating includes the steps of (a) forming trenches through the semiconductor layer, through the underlying dielectric layer, through the underlying first doped region, and partially into the substrate; and (b) filling the trenches with a dielectric material.

A second method includes the steps of (a) providing a first substrate having a first major surface and an oppositely disposed second major surface; (b) doping the first major surface with a dopant having a first type of electrical conductivity to form a first doped region adjacent to the first major surface; (c) forming an electrically insulating dielectric layer on the first major surface; (d) thermally bonding a second substrate to the dielectric layer and thinning the second substrate to provide a semiconductor layer having a predetermined thickness; (e) forming a plurality of openings through the semiconductor layer and the electrically insulating dielectric layer; (f) counter-doping portions of the first doped region through the openings with a dopant having a second type of electrical conductivity, thereby forming a plurality of second doped regions each of which corresponds to a portion of a radiation detector unit cell; (g) fabricating a readout integrated circuit within a portion of the semiconductor layer within each of the unit cells; (h) conductively coupling each of the readout integrated circuits to the underlying portion of the second doped region; and (i) doping the second major surface with a dopant having the first type of electrical conductivity to form a third doped region adjacent to the second major surface, the second major surface being a radiation receiving surface.

In this further embodiment it is not necessary to make channel stop trench cuts into the bonded silicon layers, as in the previous embodiment. Instead, intervening portions of the first doped region function as channel stops. This embodiment thus significantly reduces processing complexity.

As such, this invention teaches fabrication techniques that employ the inherent versatility of the hybrid array approach while eliminating the size, cost and yield restrictions imposed by conventional bump technology.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Reference is now made to FIGS. 1a–1e for illustrating a presently preferred fabrication process in accordance with a first embodiment of this invention. Although these Figures illustrate the fabrication of a single monolithic radiation detector/readout circuit combination, it will be realized that typically a large number of such devices are simultaneously fabricated as a one or two dimensional array. As employed herein the term "monolithic" is intended to indicate that the radiation detector and associated readout are fabricated on or over a common substrate, and are not required to be individually fabricated and then subsequently connected, or hybridized, together.

Figure 1A:
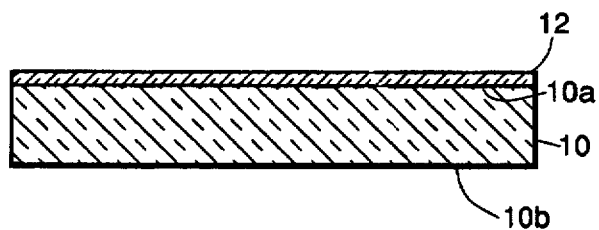
FIGS. 1a–1e illustrate process steps in accordance with this invention to fabricate a radiation detector/readout circuit array.

In FIG. 1a a nominally 10 mil thick <100> silicon substrate 10 has a heavily doped layer 12 uniformly formed within a first major surface 10a. The heavily doped layer 12 functions as one radiation detector contact in the completed device. The layer 12 may be formed by implanting or diffusing a selected dopant into the surface 10a of the substrate 10. One suitable dopant is antimony which is provided at a concentration of ~$10^{19}$ atoms/cm$^3$ to dope the layer 12 as n+ material. The use of antimony is preferred in that it remains relatively stationary during a subsequent high temperature wafer bonding step. Other suitable n-type dopants may also be employed.

Figure 1B:
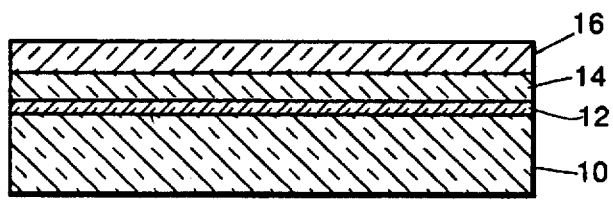

In FIG. 1b a silicon dioxide or silicon nitride dielectric layer 14 is formed upon the surface 10a of the substrate 10 so that the doped layer 12 is covered. Alternately, the oxide or nitride layer may be formed in the second silicon wafer; or, a portion of the oxide or nitride layer may be formed in each of the two silicon wafers. A suitable thickness for the dielectric layer 14 is approximately one micrometer. A bonded <100> device grade silicon layer 16 is then formed over the dielectric layer 14 such that the dielectric layer 14 is interposed between the silicon layer 16 and the doped surface layer 12. A preferred method for forming the silicon layer 16 is to thermally bond a silicon wafer to the dielectric layer 14, and to then thin the bonded wafer by a mechanical process and/or by a chemical process. A suitable thickness for the silicon layer 16 is in a range of several micrometers to approximately 1000 Å, depending in part on the desired type of readout circuitry (e.g., CMOS, BIMOS, fully depleted) that will be fabricated within the silicon layer 16.

Figure 1C:
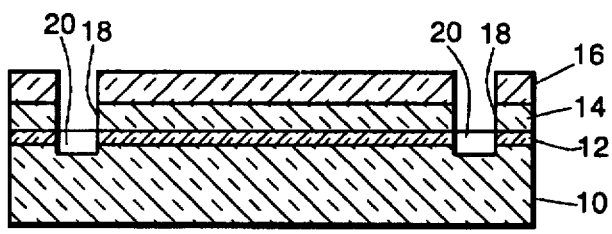

In FIG. 1c a channel stop trench 18 is opened at least through the silicon layer 16 and the dielectric layer 14. In one embodiment the underlying doped layer 12 and the silicon substrate 10 are counter-doped p+ by implanting or diffusing through the trench 18 with, by example, boron to electrically isolate the enclosed region of the silicon substrate 10. This partitions the doped layer 12 and underlying substrate material 10 into adjacently disposed regions, and thus delineates areas of radiation detector unit cells. The counter-doped region is designated as 20 in the Figures. Alternately the trench 18 can be extended through the doped layer 12 and into the substrate 10, and then subsequently back-filled with a suitable dielectric such as polysilicon, silicon dioxide or silicon nitride. Whether counter-doped or dielectrically isolated, the region 20 extends into the substrate 10 to a depth that exceeds a depth at which the p-n junction will subsequently be found in the operational device, thereby electrically isolating the p-n diodes from one another. By example, the region 20 may extend for approximately three micrometers into the substrate 10.

In the completed device the surface 10a from which the region 20 extends can be operated near ground potential. As such, and for the case where the region 20 represents a counter-doped region, it is generally not necessary to provide an electrical contact to the region 20, which may therefore float electrically. However, if desired metalization can be subsequently provided to electrically contact the region 20 so as to bias it at a desired potential.

Figure 1D:
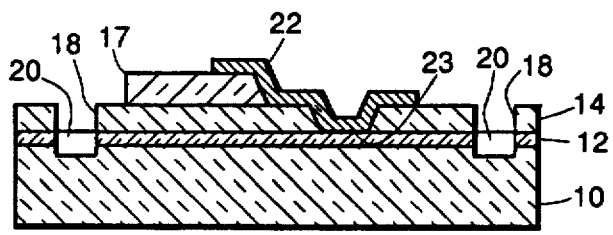

In FIG. 1d conventional photolithographic processes are employed to fabricate the desired readout circuit 17 within the silicon layer 16. By example, the readout circuit 17 may be fabricated by a conventional CMOS or BIMOS process, or by a fully depleted device process, and may contain any desired types and numbers of passive and active components, such as transimpedance amplifiers and associated circuitry. By example, and when fabricating a two dimensional array of radiation detectors, the readout circuit 17 may be an x-y type of readout enabling a single radiation detector to be addressed and read-out.

An aperture is then opened through the dielectric layer 14 and metalization 22, such as aluminum, is applied to form an ohmic contact with the underlying portion of the doped layer 12. This electrically couples the readout circuit 17 to one contact (the doped layer 12) of the underlying photodiode. Not shown in the Figures are signal lines for interconnecting the readout integrated circuit 17 with external circuitry, and the required power and ground buses.

Figure 1E:
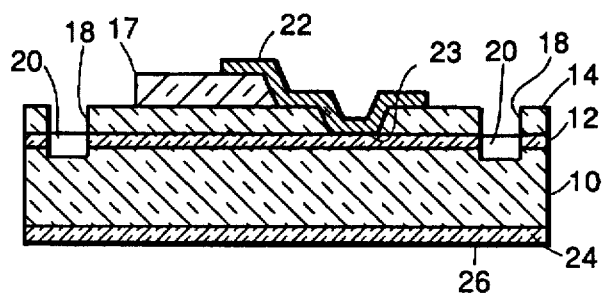

In FIG. 1e the second major surface 10b of the substrate 10 may be thinned, thereby moving the surface 10b closer to the surface 10a. To take full advantage of the absorbed radiation (that is, to fully collect the electron-hole pairs generated by the absorbed radiation), the substrate 10 should be fully depleted; substrate doping, substrate thickness, and bias potential can be chosen appropriately to achieve full depletion. The surface 10b is then implanted or diffused, annealed, and optionally metalized to form the second detector contact. As a result a second doped layer 24 is formed that is of the opposite conductivity type as the layer 12. By example, if the layer 12 is doped n+ then the layer 24 is doped p+ by implanting or diffusing boron into the surface 10b of the substrate 10. A suitable boron concentration is on the order of $10^{12}$–$10^{13}$ atoms/cm$^3$ for the substrate dopant and in the range of $10^{19}$ to $10^{20}$ atoms/cm$^3$ for the p+ dopant. Alternatively, if the layer 12 is doped p+ then the layer 24 is doped n+.

A common electrode is then formed by making an ohmic contact to the layer 24 by depositing a thin layer 26 of a transparent (at the wavelengths of interest) metal or oxide, such as indium-tin-oxide (ITO).

Figure 4:
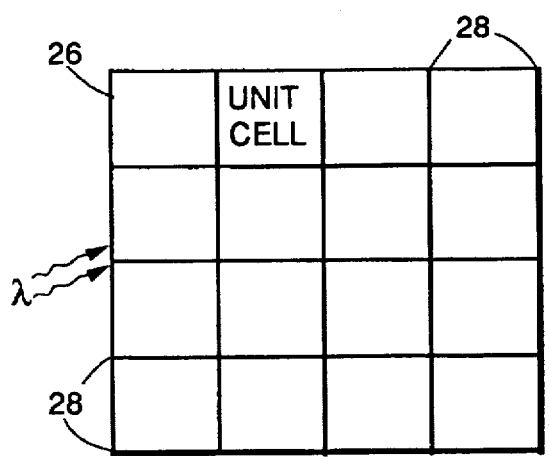
FIG. 4 is an elevational view of a radiation receiving surface of the completed two dimensional array of radiation detectors showing an embodiment of the invention where a metal grid is provided to form a common contact on the radiation receiving surface.

Alternatively, an open mesh or grid 28 of metal can be deposited as is shown in the view of FIG. 4.

Furthermore, and if the layer 24 is doped sufficiently heavy, then its electrical conductivity may be suitable for forming the common electrode without requiring either a transparent coating or a mesh electrode.

Figure 2:
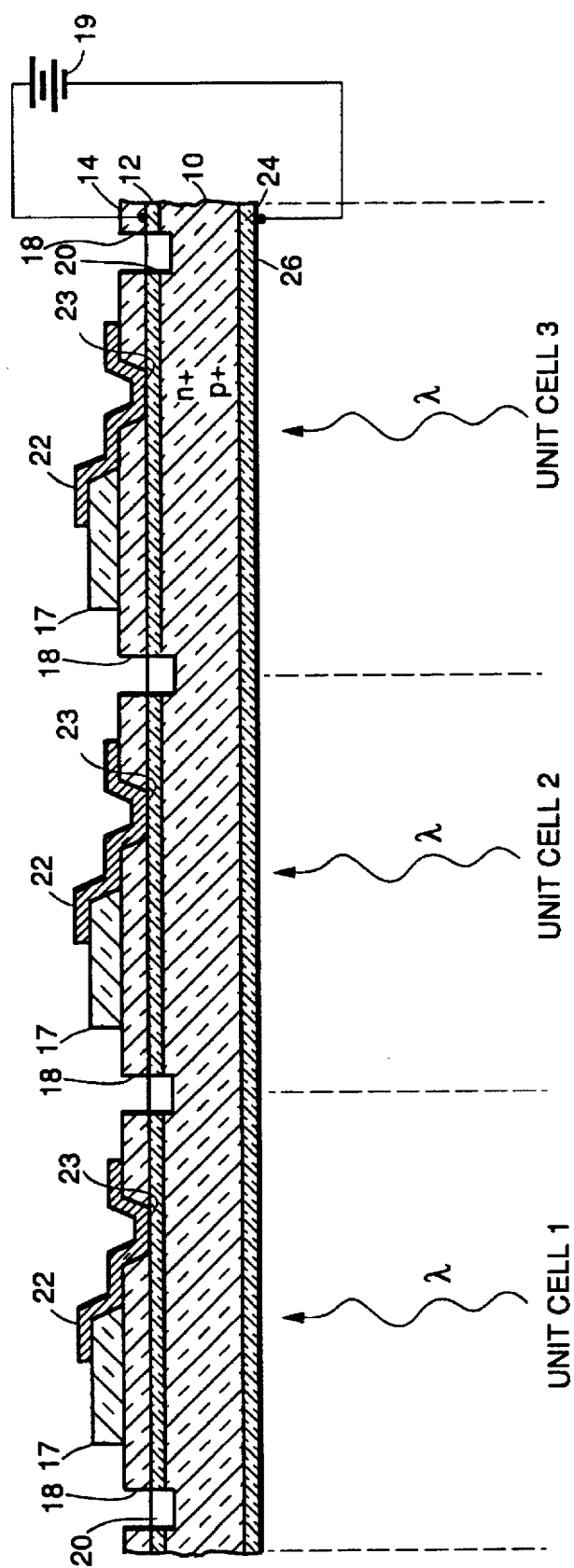
FIG. 2 in enlarged cross-sectional view, not to scale, of a portion of a completed array of radiation detectors and associated readout integrated circuits.

FIG. 2 shows in cross-section a plurality of unit cells (1–3) that are receiving radiation (λ). Each unit cell may have dimensions of from, by example, 5 micrometers to 20 micrometers on a side. The unit cells are operated under a reverse bias of, by example, 10 V–30 V which results in a depletion region extending substantially all the way though the thickness of the silicon substrate 10. The bias potential is shown schematically as a battery 19. The absorption of the incident radiation within the silicon substrate 10 results in the formation of electron-hole pairs, and minority charge carriers are collected by the p-n junction within each unit cell. Each p-n junction is electrically isolated from the p-n junctions of adjacent unit cells by the counter-doped or dielectrically isolating regions 20. The collection of minority charge carriers results in a detectable electrical signal that is amplified by the associated readout circuit 17 associated with each unit cell. Typically, the charge is stored on a capacitor at each pixel site. This charge is then read out as a charge, or a current, or a voltage, depending on the type of circuitry that is placed at each pixel element, as well as on the peripheral amplifier circuitry.

Figure 3:
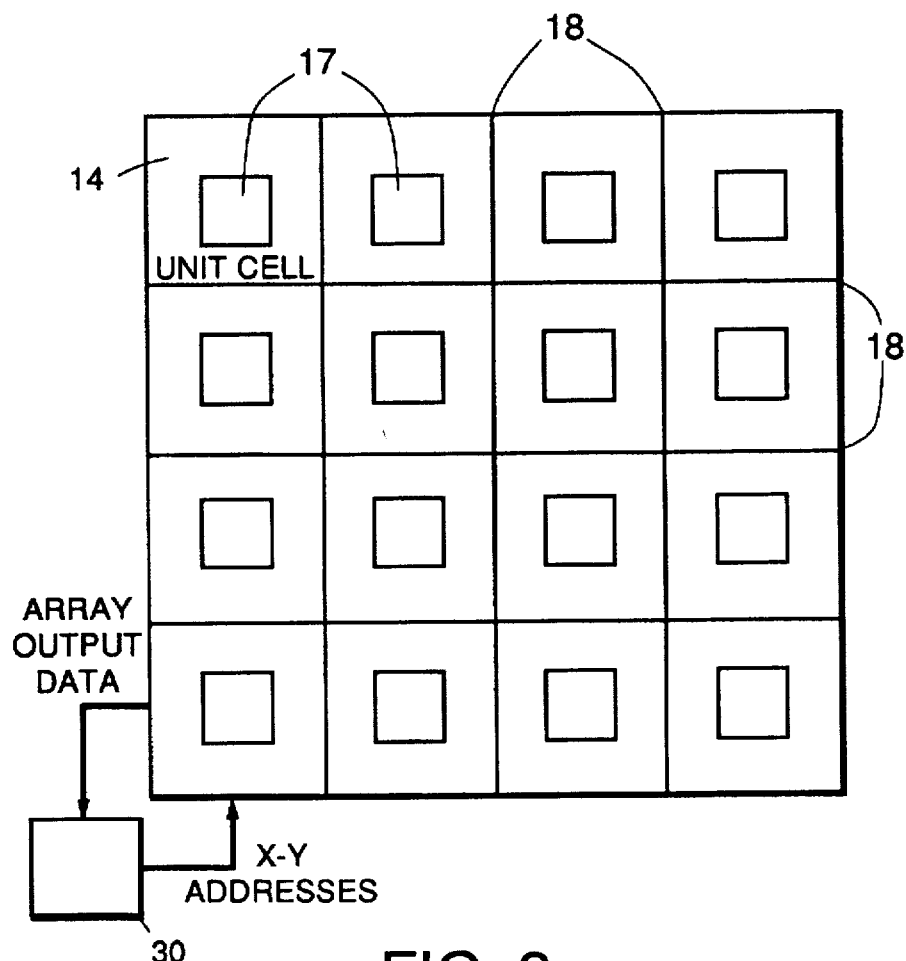
FIG. 3 is an elevational view of a completed two dimensional array of radiation detectors that are x-y addressed to read out individual ones of the radiation detector.

As shown in FIG. 3, the individual readout circuits 17 can be addressed in x-y fashion by a readout controller 30 to output the signal from a given one of the unit cells.

Reference is now made to FIGS. 5a–5e for illustrating a presently preferred fabrication process in accordance with a second embodiment of this invention. In these Figures numerals which correspond to FIGS. 1a–1e are numbered correspondingly. In the second embodiment it is not necessary to make channel stop trench cuts into the bonded silicon layers. Instead, the layer 12 is used for the channel stop. If contact to the channel stop layer 12 is desired, the contact can be made at the periphery of the array. An advantage of this embodiment is that by eliminating the trench cuts it is possible to make an array with a significantly smaller pixel area and/or an array with fewer defects and higher yield. The specific dopant types for the channel stop and diodes is chosen to provide a desired level of radiation hardness. That is, holes caused by ionizing radiation, such as gamma radiation, will cause the n-type channel stop layer 12 to turn "off" rather than "on".

Figure 5A:
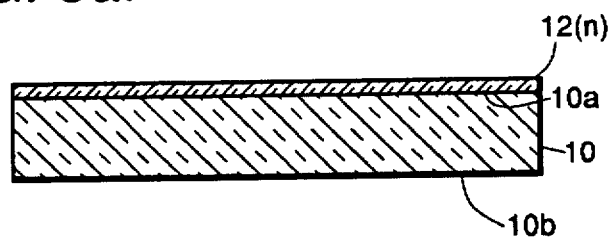
FIGS. 5a–5e illustrate process steps in accordance with a second embodiment of this invention to fabricate a radiation detector/readout circuit array.
Figure 5B:
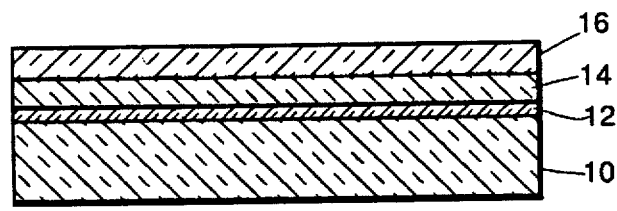

In FIG. 5a an intrinsic or nearly intrinsic p-type substrate 10 (e.g., $10^{12}$–$10^{13}$ atoms/cm$^3$) has an n-type doped layer 12 formed thereon to a depth of, by example, 0.5 micrometers. The n-type layer 12 functions as a channel stop in the completed device. A suitable dopant is antimony, and a suitable concentration for the n-type channel stop layer 12 is approximately $10^{16}$ to $10^{17}$ atoms/cm$^3$. The processing shown in FIG. 5b is identical to that shown in FIG. 1b.

Figure 5C:
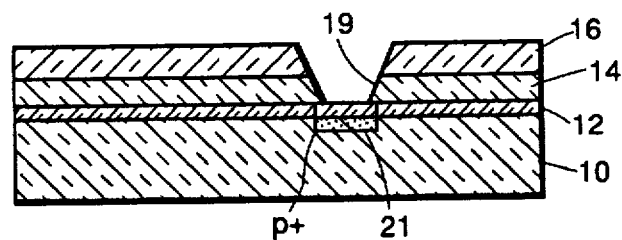

In FIG. 5c the trench 18 of FIG. 1c is eliminated and instead processing continues to fabricate an opening 19 through the silicon layer 16 and dielectric layer 14 so as to expose the n-type layer 12. A p$^+$ region 21 is then formed within the n-type layer 12, and typically also within a portion of the substrate 10, by implanting or diffusing a suitable p-type dopant, such as boron. A suitable concentration for the p-type dopant is approximately $10^{18}$ to $10^{19}$ atoms/cm$^3$, which is implanted or diffused through the layer 12 and into the substrate 10 to a depth of approximately 0.75 to 1 micrometer.

Figure 5D:
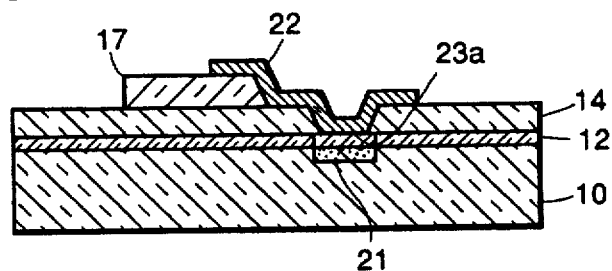
Figure 5E:
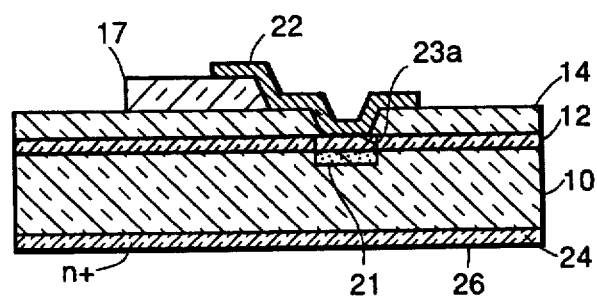

Processing continues in FIG. 5d to fabricate the desired read-out circuit 17 within the silicon layer 16. Next, metalization 22 is applied to form an ohmic contact 23a with the underlying p+diode 21. Processing continues in FIG. 5e to form a heavily doped n$^+$ layer 24 by doping with, by example, arsenic at a level of approximately $10^{19}$ to $10^{20}$ atoms/cm$^3$.

In operation the resulting photodiode (region 21 and layer 24) is operated with a reverse bias of sufficient magnitude to fully deplete the intervening substrate 10, thereby effectively forming a p-intrinsic-n (PIN) diode. A suitable bias potential for the layer 24 is +10 volts, and a suitable bias potential for the p+ region 21 is −2 volts, assuming a thickness for the substrate 10 of approximately 8 mils. The channel stop layer 12 can be operated at ground potential.

The array of this embodiment of the invention may be further processed to provide the common transparent electrode 26 as in FIG. 4, and may be x-y addressed as in FIG. 3.

Figure 6:
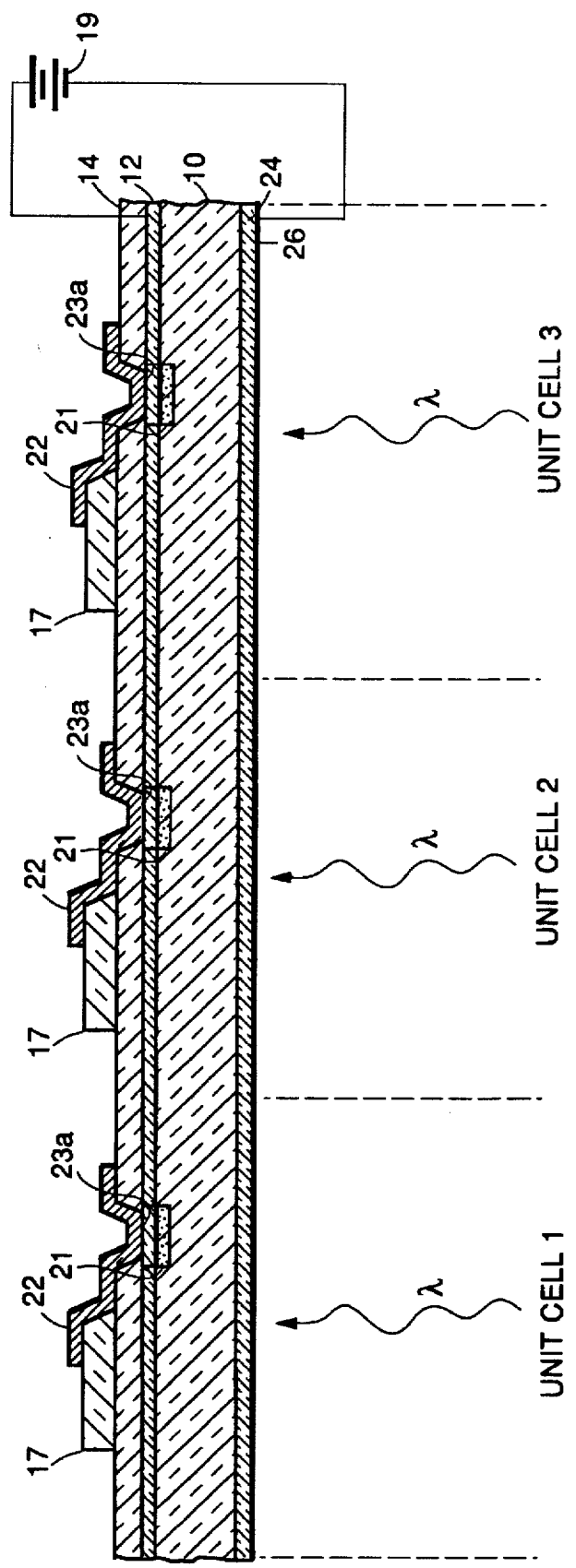
FIG. 6 is an enlarged cross-sectional view, not to scale, of a portion of a completed array of radiation detectors and associated readout integrated circuits that are fabricated in accordance with the second embodiment.

FIG. 6 shows in cross-section the plurality of unit cells formed in accordance with this second embodiment of the invention. As can be seen, individual ones of the p$^+$ diode regions 21 are isolated from one another by the intervening channel stop layer 12.

It can be appreciated that the teaching of this invention provides a monolithic array of radiation detector/readout circuits having a potential for a high fill factor and small pixel size, relative to the conventional hybrid approach of the prior art.

It should be realized that other semiconductor materials, dopants, dopant concentrations, dimensions, and the like may be employed without departing from the scope of the teaching of this invention. By example, in the first embodiment shown in FIGS. 1 and 2 the layer 12 may be doped p+ and the layer 24 doped n+. In this case, and if a counter-dopant is used in the regions 20, then a suitable n+ dopant, such as Sb or As, is selected. Also by example, in the second embodiment shown in FIGS. 5 and 6 the layer 12 may be doped p-type, the counter-doped regions 21 doped n+, and the common layer 24 doped p$^+$. The teaching of this invention can be employed for forming, by example, p-n junction photodiodes, avalanche photodiodes, and PIN photodiodes.

Thus, while the invention has been particularly shown and described with respect to presently preferred embodiments thereof, it will be understood by those skilled in the art that changes in form and details may be made therein without departing from the scope and spirit of the invention.

What is claimed is:

1. A monolithic array of photodiodes and readout integrated circuits, comprising:
   a substrate comprised of a semiconductor material, said substrate having a first major surface and an oppositely disposed radiation receiving second major surface, said substrate having a first doped region adjacent to said first major surface that is doped with a dopant having a first type of electrical conductivity, said substrate having a second doped region adjacent to said second major surface that is doped with a dopant having a second type of electrical conductivity;
   means for partitioning said first doped region of said substrate into a plurality of adjacently disposed and electrically isolated areas each of which corresponds to one photodiode unit cell;
   wherein each of said unit cells includes,
      an electrically insulating dielectric layer disposed on said first major surface;
      a semiconductor layer disposed on said electrically insulating dielectric layer, said semiconductor layer comprising a unit cell readout integrated circuit; and
      an electrode directly connecting said readout integrated circuit to an underlying portion of said first doped region;
   said monolithic array further comprising a common electrode disposed over said second major surface.

2. An array as set forth in claim 1, wherein said partitioning means is comprised of:
   a counter-doped region of the substrate surrounding said underlying portion of said first doped region.

3. An array as set forth in claim 1, wherein said partitioning means is comprised of:
   trenches formed through said underlying dielectric layer, through said underlying first doped region, and partially into said substrate; and
   a dielectric material filling said trenches.

4. An array as set forth in claim 1 and further comprising means for individually addressing individual ones of said readout integrated circuits.

5. A monolithic array of photodiodes and readout integrated circuits, comprising:
   a substrate comprised of a semiconductor material, said substrate having a first major surface and an oppositely disposed radiation receiving second major surface, said substrate having a first doped layer region adjacent to said first major surface that is doped with a dopant having a first type of electrical conductivity, said substrate having a plurality of counter-doped regions formed through said first doped layer region, each of said counter-doped regions being doped with a dopant having a second type of electrical conductivity, said substrate further having a second doped layer region adjacent to said second major surface that is doped with a dopant having the first type of electrical conductivity; wherein
      each of said plurality of counter-doped regions is conductively coupled to an associated readout integrated circuit that is formed within a bonded oxide semiconductor layer that overlies said first major surface and that is electrically insulated therefrom by an intervening layer of dielectric bonding oxide, each of said counter-doped regions and associated readout integrated circuits being associated with one photodiode unit cell having a photodiode comprised of the associated counter-doped region, a portion of said second doped layer region, and an intervening portion of said substrate; and wherein
      a portion of said first doped layer region that surrounds each of said counter-doped regions functions as a channel stop.

6. An array as set forth in claim 5 wherein said monolithic array further comprises a common electrode disposed over said second major surface.

7. An array as set forth in claim 5 and further comprising means for individually addressing individual ones of said readout integrated circuits.

* * * * *